United States Patent
Xiao

(10) Patent No.: US 11,398,490 B2
(45) Date of Patent: Jul. 26, 2022

(54) STACKED NEURAL DEVICE STRUCTURE AND MANUFACTURING METHOD THEREOF

(71) Applicant: SiEn (QingDao) Integrated Circuits Co., Ltd, Shandong (CN)

(72) Inventor: Deyuan Xiao, Shandong (CN)

(73) Assignee: SiEn (QingDao) Integrated Circuits Co., Ltd, Qingdao (CN)

( * ) Notice: Subject to any disclaimer, the term of this patent is extended or adjusted under 35 U.S.C. 154(b) by 0 days.

(21) Appl. No.: 17/091,425

(22) Filed: Nov. 6, 2020

(65) Prior Publication Data

US 2021/0167077 A1    Jun. 3, 2021

(30) Foreign Application Priority Data

Dec. 3, 2019    (CN) .......................... 201911221410.8

(51) Int. Cl.
*H01L 27/11556* (2017.01)
*H01L 21/28* (2006.01)
(Continued)

(52) U.S. Cl.
CPC ........ *H01L 27/11556* (2013.01); *G06N 3/063* (2013.01); *H01L 29/40114* (2019.08);
(Continued)

(58) Field of Classification Search
CPC ......... H01L 27/11556; H01L 29/40114; H01L 29/42324; H01L 29/66439; H01L 29/775;
(Continued)

(56) References Cited

U.S. PATENT DOCUMENTS

2013/0009235 A1    1/2013  Yoo
2015/0115345 A1*   4/2015  Nowak ............. H01L 29/66833
                                                        257/314
(Continued)

FOREIGN PATENT DOCUMENTS

| CN | 108258038 A   | 7/2018 |
| CN | 108258044 A   | 7/2018 |
| TW | 2018024514 A  | 7/2018 |

OTHER PUBLICATIONS

Taiwanese Office Action, dated Mar. 9, 2021, in a counterpart Taiwanese patent application, No. TW 109124534.

*Primary Examiner* — Mohammed R Alam
(74) *Attorney, Agent, or Firm* — Chen Yoshimura LLP

(57) ABSTRACT

This invention provides a three-dimensional junctionless neuron network device and a manufacturing method thereof. The device comprises: a substrate; and a stack structure is formed on the surface of the substrate, the stack structure comprises alternately stacked gate electrode layers and isolation layers and has a channel hole penetrating the substrate; a weighting gate layer is formed on the surface of the channel hole, and the weighting gate layer has a gap from the bottom of the channel hole; a gate dielectric layer is located on the weight gate between the layer and the gate electrode layer; a tunneling dielectric layer on the surface of the weighting gate layer; a channel layer filled in the channel hole, the channel layer being in contact with the substrate. The invention adopts a vertically stacked isolation layer and gate layer design. The stack structure has an array of channel holes. By forming a vertically distributed neuron network device string in the channel hole and completely surrounding the gate design, it can improve the packing density of the neuron network device, on the other hand, as well as the gate control ability of the neuron network device.

9 Claims, 13 Drawing Sheets

(51) Int. Cl.
*G06N 3/063* (2006.01)
*H01L 29/66* (2006.01)
*H01L 29/775* (2006.01)
*H01L 29/423* (2006.01)

(52) U.S. Cl.
CPC .................. *H01L 29/42324* (2013.01); *H01L 29/66439* (2013.01); *H01L 29/775* (2013.01)

(58) Field of Classification Search
CPC ........... H01L 29/0676; H01L 27/11582; H01L 27/11521; G06N 3/063; B82Y 10/00
See application file for complete search history.

(56) References Cited

U.S. PATENT DOCUMENTS

2016/0336338 A1* 11/2016 Song .................. H01L 23/5226
2018/0269229 A1   9/2018 Or-Bach et al.

* cited by examiner

STACKED NEURAL DEVICE STRUCTURE AND MANUFACTURING METHOD THEREOF

CROSS-REFERENCE TO RELATED APPLICATIONS

This application claims priority to P.R.C. Patent Application No. 201911221410.8 titled "A three-dimensional junctionless neuron network device and manufacturing method thereof," filed on Dec. 3, 2019, with the State Intellectual Property Office of the People's Republic of China (SIPO).

TECHNICAL FIELD

The present disclosure relates to the field of semiconductor design and manufacturing, and particularly relates to a three-dimensional junctionless neuron network and a manufacturing method thereof.

BACKGROUND

With the development of integrated circuits and the improvement of their integration, traditional silicon integrated circuits based on the function of a single transistor have encountered many difficult and urgent problems to be solved. The so-called neuron transistor (or neuMOS) as an unit transistor with powerful functions, which provides an effective way to solve the problems caused by the increase in the number of transistors and interconnections in integrated circuits.

Neuron devices are functionally equivalent to the neuron cells (neurons) that make up the human brain, eyes and other parts to realize information transmission through circuits. Specifically, a neural device can separately weighting multiple input signals, and when the addition result of the weighted signals reaches a threshold, a predetermined signal is output. This way of weighting the input signal of the neuron device is realized by the neuron transistor in it. The neuron transistor has a gate structure of multiple input electrodes. When the sum of the input voltages of the multiple input gates reaches a predetermined value, the source and the drain will be connected. The weighting method of the neuron device is equivalent to the synapse of the nerve cell, which can be composed of a resistor and a field effect transistor, and the neuron transistor is equivalent to the cell body of this neuron cell. The summing process of the neuron transistor on the gate can use the voltage mode of the capacitive coupling effect. There is no other current except the capacitor charge and discharge current, so there is basically no power consumption.

Since 2010, due to the development of the big data industry, the amount of data has shown an explosive growth trend, and the traditional computing architecture cannot support the large-scale parallel computing needs of deep learning, so the research community has carried out a new round of technology development and application of AI chips the study. AI chip is one of the core technologies in the era of artificial intelligence, which determines the platform's infrastructure and development ecology.

The brain-like chip does not use the classic von Neumann architecture, but is based on a neuromorphic architecture design, represented by IBM Truenorth. IBM researchers built a prototype of a neural chip using a storage unit as a synapse, a calculation unit as a neuron, and a transmission unit as an axon. Currently, Truenorth uses Samsung's 28 nm power consumption process technology. The on-chip network composed of 5.4 billion transistors has 4096 nerve synapse cores, and the real-time power consumption is only 70 mW. Because synapses require variable weights and memory functions, IBM uses phase change non-volatile memory (PCM) technology compatible with the CMOS process to experimentally implement new synapses and accelerate the commercialization process.

SUMMARY

In light of the abovementioned problems, an object of the present disclosure is to provide a three-dimensional junctionless neuron network device and a manufacturing method thereof, which can solve the problem of reliability and manufacturing complexity of the device in the prior art.

An objective of the present invention is to provide a manufacturing method of a three-dimensional junctionless neuron network device, comprising the steps of: 1) providing a substrate with a stack structure formed on the surface of the substrate, wherein the stack structure comprises alternately stacked sacrificial layers and isolation layers; 2) etching the stack structure to form at least one channel hole penetrating to the substrate; 3) forming a weighting gate layer on the surface of the channel hole, and etching the weighting gate layer on the bottom of the channel hole to isolate the weighting gate layer and the substrate; 4) forming a tunneling dielectric layer on the bottom of the channel hole and the weighting gate layer, and etching the tunneling dielectric layer on the bottom of the channel hole to expose the substrate; 5) filling in a channel layer in the channel hole, the channel layer in contact with the substrate; 6) forming at least one etching trench in the stack structure, and selectively etching the sacrificial layer to form at least one void; 7) forming a gate dielectric layer on the surface of the void; 8) forming a gate electrode layer in the void and the trench; and 9) removing the gate electrode layer in the trench.

In accordance with some embodiments, the sacrificial layer comprises borosilicate glass or silicon nitride, and the isolation layer comprises silicon dioxide.

In accordance with some embodiments, the channel hole has a shape of a cylinder or an elliptical cylinder.

In accordance with some embodiments, the weighting gate layer formed on the surface of the channel hole by using chemical vapor deposition process or atomic layer deposition process in step 3), and the weighting gate layer comprises a polysilicon layer.

In accordance with some embodiments, a gap is formed between the weighting gate layer and the substrate after etching the weighting gate layer on the bottom of the channel hole in step 3), and the tunneling dielectric layer filled in the gap in step 4).

In accordance with some embodiments, the channel layer comprises an n type doped polysilicon.

In accordance with some embodiments, the gate dielectric layer comprises silicon dioxide or high-k dielectric material in step 7).

In accordance with some embodiments, the gate electrode layer comprises one of tantalum nitride, titanium nitride and tungsten or its combination in step 8).

In accordance with some embodiments, the method further comprises the steps of:
  forming an insulating layer on the etching trench and the stack structure;
  forming a through hole in the insulating layer, the through hole exposing the channel layer;
  filling the through hole with conductive material; and forming at least one bit line, and the bit line connected to the conductive material.

Another objective of the present invention is to provide a three-dimensional junctionless neuron network device, comprising: a substrate with a stack structure formed on the surface of the substrate, wherein the stack structure comprises alternately stacked gate electrode layers and isolation layers, and the stack structure has at least one channel hole penetrating to the substrate; a weighting gate layer formed on the surface of the channel hole, and the weighting gate layer has a gap with the bottom of the channel hole; a gate dielectric layer located between the weighting gate layer and the gate electrode layer; a tunneling dielectric layer on the surface of the weighting gate layer; and a channel layer filled in the channel hole, and the channel layer in contact with the substrate.

In accordance with some embodiments, the isolation layer comprises silicon dioxide.

In accordance with some embodiments, the channel hole has a shape of a cylinder or an elliptical cylinder.

In accordance with some embodiments, the weighting gate layer comprises a polysilicon layer.

In accordance with some embodiments, the tunneling dielectric layer filled in a gap between the weighting gate layer and the substrate.

In accordance with some embodiments, the channel layer comprises an n type doped polysilicon.

In accordance with some embodiments, the gate dielectric layer comprises silicon dioxide or high-k dielectric material.

In accordance with some embodiments, the gate electrode layer comprises one of tantalum nitride, titanium nitride and tungsten or its combination.

In accordance with some embodiments, the three-dimensional junctionless neuron network device, further comprises: an insulating layer on the stack structure, and the insulating layer with a through hole to expose the channel layer; conductive material filled in the through hole; and at least one bit line connected to the conductive material.

As described above, the stacked neural device structure and the manufacturing method thereof of the present invention have the following beneficial effects:

The invention realizes a nerve device structure arranged in an array on a plane and vertically stacked in the longitudinal direction and a manufacturing method thereof. The on and off of each neuron transistor in the nerve device structure is controlled by the peripheral circuit in the substrate, greatly improved the integration of neuron devices.

The neuron transistor adopted by the invention adopts a junctionless transistor structure, on the one hand, it can avoid the implantation steps of the source region and the drain region, greatly reducing the difficulty of the process, on the other hand, the carriers can avoid incomplete interface between the gate oxidation layer and the semiconductor channel. Most carriers in the channel moving into the semiconductor channel instead of the surface. The carriers are limited by the interface scattering, which improves the carrier mobility, reduces errors, and increases the response speed of the device.

BRIEF DESCRIPTION OF THE DRAWINGS

Exemplary embodiments will be more readily understood from the following detailed description when read in conjunction with the appended drawings, in which.

DETAILED DESCRIPTION

Figure 1A:
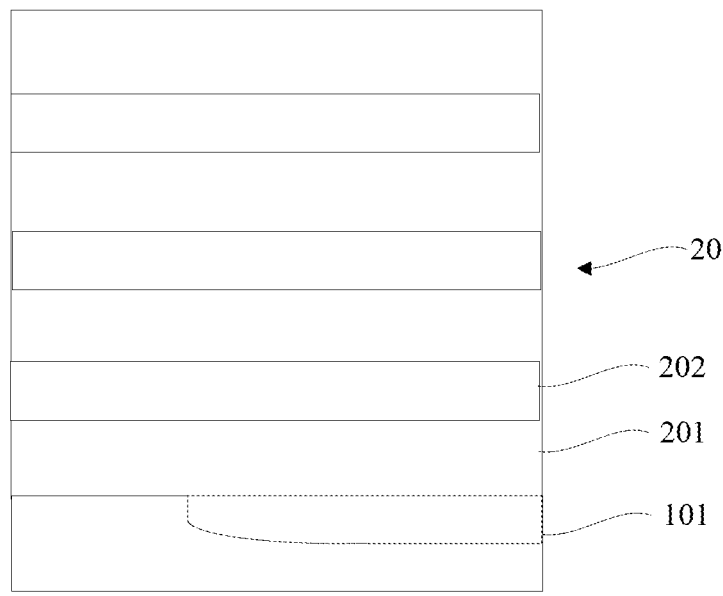
FIG. 1A to FIG. 13 are schematic diagrams of the steps of the method for manufacturing a three-dimensional junctionless neuron network device according to an embodiment of the present invention.

The embodiments of the present invention are described below by way of specific examples, and those skilled in the art can readily understand other advantages and effects of the present invention from the disclosure of the present disclosure. The present invention may be embodied or applied in various other specific embodiments, and various modifications and changes can be made without departing from the spirit and scope of the invention.

The following describes the embodiments of the present invention through specific examples, and those skilled in the art can easily understand other advantages and effects of the present invention from the contents disclosed in this specification. The present invention can also be implemented or applied through different specific embodiments. The details in this specification can also be based on different viewpoints and applications, and various modifications or changes can be made without departing from the spirit of the present invention.

For example, when describing the embodiments of the present invention, for convenience of explanation, the cross-sectional view showing the structure of the device will not be partially enlarged according to the general scale, and the schematic diagram is only an example, which should not limit the scope of protection of the present invention. In addition, the actual production should include the three-dimensional dimensions of length, width and depth.

For the convenience of description, spatial relations such as "below", "under", "above", "upper", etc. may be used here to describe a device or the relationship between features and other elements or features. It will be understood that these spatial relationship words are intended to include other directions of elements in use or in operation than those depicted in the drawings. In addition, when a layer is referred to as being "between" two layers, it can be the only layer between the two layers, or one or more intervening layers may also be present.

In the context of the present application, a structure in which the first feature described "above" the second feature may include embodiments where the first and second features are formed in direct contact, or may include additional features formed in the first and Examples between the second features, so that the first and second features may not be in direct contact.

It should be noted that the illustration provided in this embodiment only illustrates the basic concept of the present invention in a schematic manner. Therefore, the illustration only shows the components related to the present invention instead of the actual number of components, shape and dimension drawing, the type, number and ratio of each component can be changed at will during its actual implementation, and the component layout type may also be more complicated.

Figure 1B:
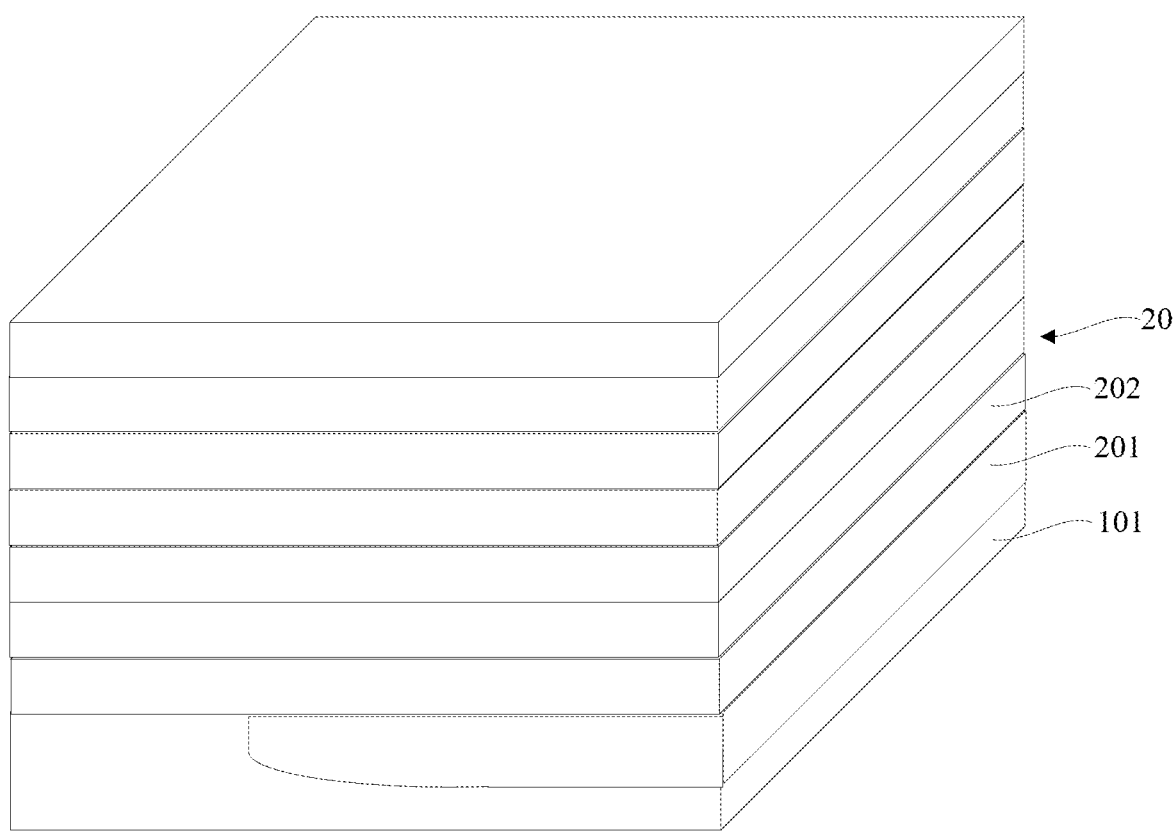

As shown in FIGS. 1A to 1B, this embodiment provides a method for manufacturing a three-dimensional junctionless neuron network device. The manufacturing method includes the following steps:

As shown in FIGS. 1A to 1B, step 1) is first performed to provide a substrate 101, and a stack structure 20 is formed on the surface of the substrate 101. The stack structure 20 comprises alternately stacked sacrificial layers 202 and isolation layers 201.

The substrate 101 has peripheral circuits. The material of the substrate 101 is selected from monocrystalline silicon, polycrystalline silicon or amorphous silicon; the substrate 101 can also be selected from silicon, germanium, gallium arsenide or silicon germanium compounds; the substrate 101 can also be selected from epitaxial layers or the epitaxial layer is covered with a silicon structure; the substrate 101 may also be other semiconductor materials, which is not limited in the present invention. In this embodiment, the substrate 101 is made of silicon. The substrate 101 has a peripheral circuit, and the peripheral circuit may include a plurality of peripheral components, such as NMOS, PMOS, CMOS, diode, triode, capacitor, etc. The circuit structure of the corresponding function is composed of the above peripheral components, such as SRAM, PLL, CPU, FPGA, etc., to realize the control of three-dimensional junctionless neuron network devices.

Alternately stacked sacrificial layers 202 and isolation layers 201 may be formed on the surface of the substrate 101 by such as a chemical vapor deposition process (CVD) or an atomic layer deposition process (ALD). The material of the sacrificial layer 202 may be borosilicate glass or silicon nitride, and the material of the isolation layer 201 may be silicon dioxide.

Figure 2A:
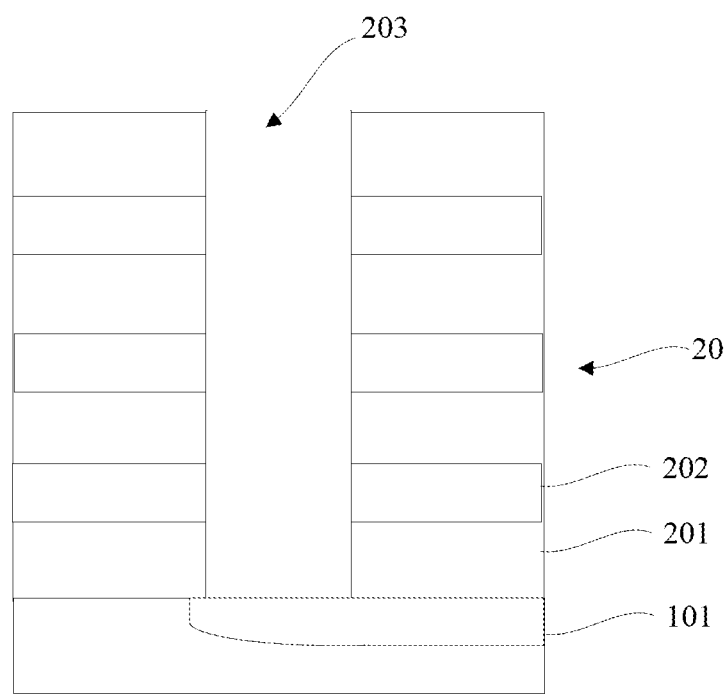
Figure 2B:
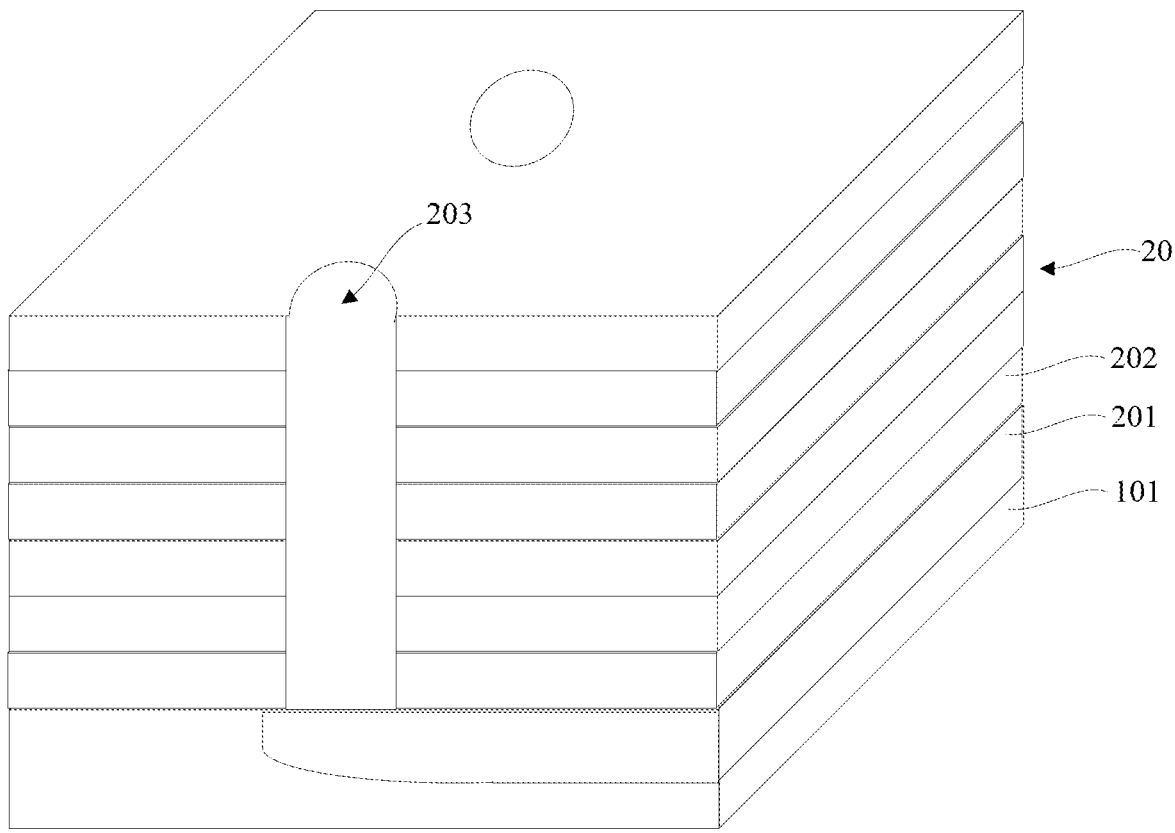

As shown in FIGS. 2A to 2B, and then proceeding to step 2), the stack structure 20 is etched to form a channel hole 203 penetrating to the substrate 101.

For example, the stack structure 20 may be etched using a lithography process and a dry etching process to form a channel hole 203 penetrating to the substrate 101, the bottom of the channel hole 203 exposes the substrate 101, and the shape of the channel hole 203 may be a cylinder or an elliptical cylinder.

As shown in FIGS. 3A to 4B, proceed to step 3), forming a weighting gate layer 301 on the surface of the channel hole 203, and etching away the weighting gate layer 301 at the bottom of the channel hole 203 to isolate the weighting gate layer 301 and the substrate 101.

Figure 3A:
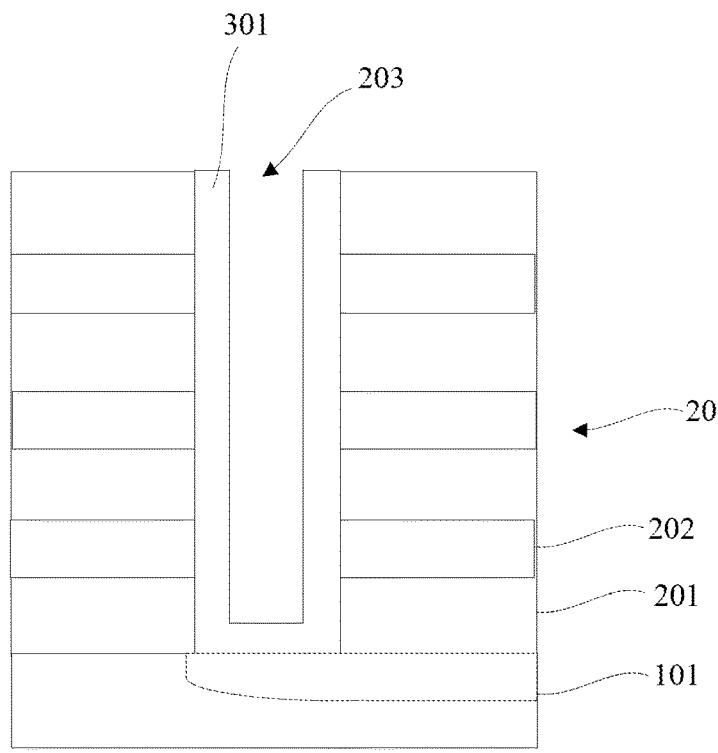
Figure 3B:
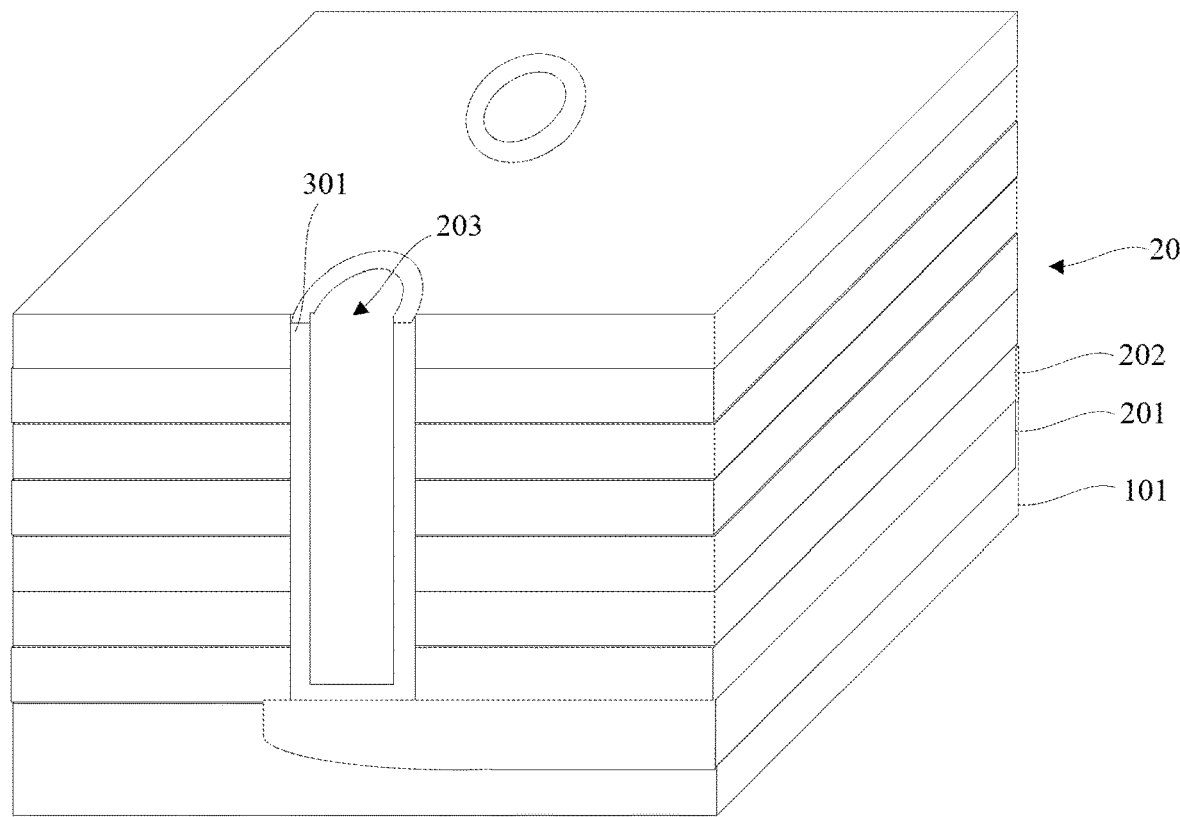

For example, a chemical vapor deposition process (CVD) or an atomic layer deposition process (ALD) may be used to form a weighting gate layer 301 on the surface of the channel hole 203, and the material of the weighting gate layer 301 may be polysilicon, such as FIGS. 3A and 3B.

Figure 4A:
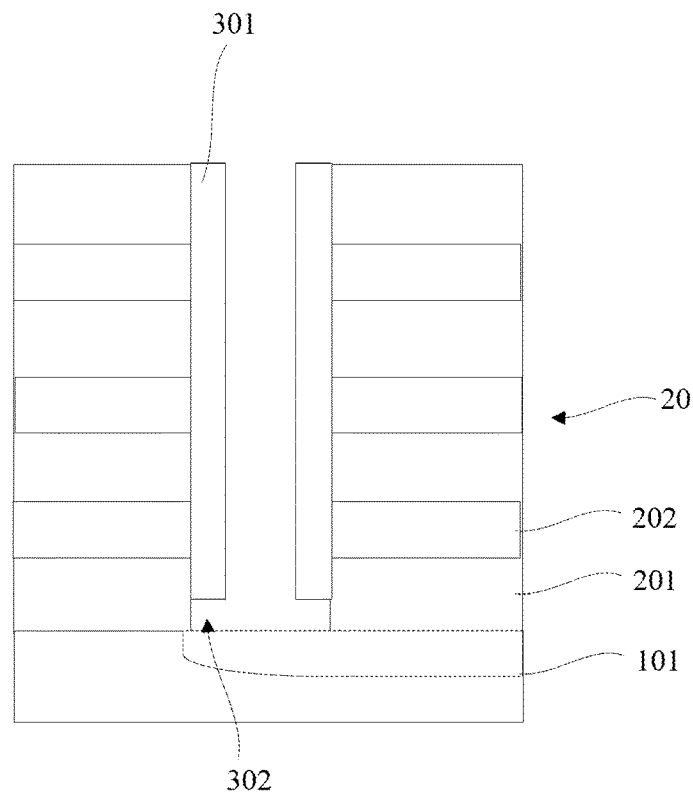
Figure 4B:
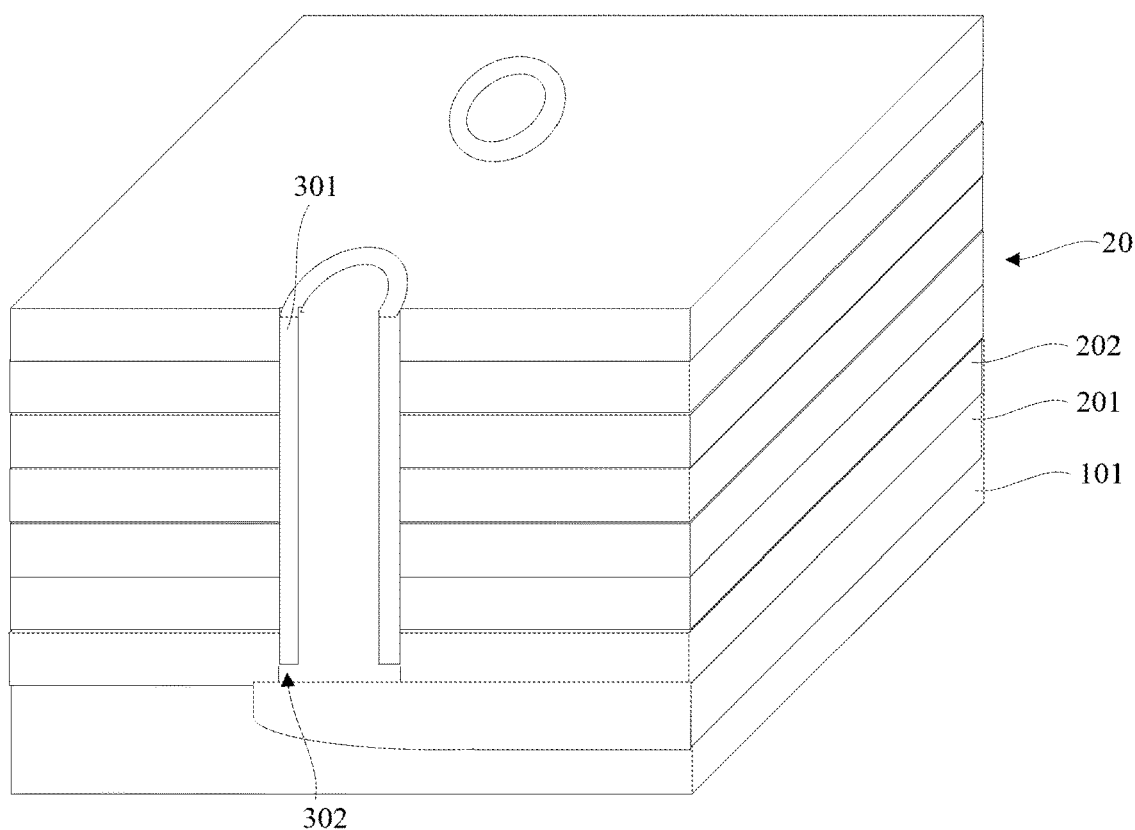

As an example, after removing the weighting gate layer 301 at the bottom of the channel hole 203, the bottom end of the weighting gate layer 301 and the substrate 101 have a gap 302, and the thickness of the gap 302 may be for example in the range of 2 to 5 nm to isolate the weighting gate layer 301 from the substrate 101 while ensuring the length of the weighting gate layer 301, as shown in FIGS. 4A and 4B.

As shown in FIG. 5A to FIG. 6B, then proceed to step 4), forming a tunneling dielectric layer 303 at the bottom of the channel hole 203 and the surface of the weighting gate layer 301, and etching to remove the tunneling dielectric layer 303 at the bottom of the channel hole 203 to expose the substrate 101.

Figure 5A:
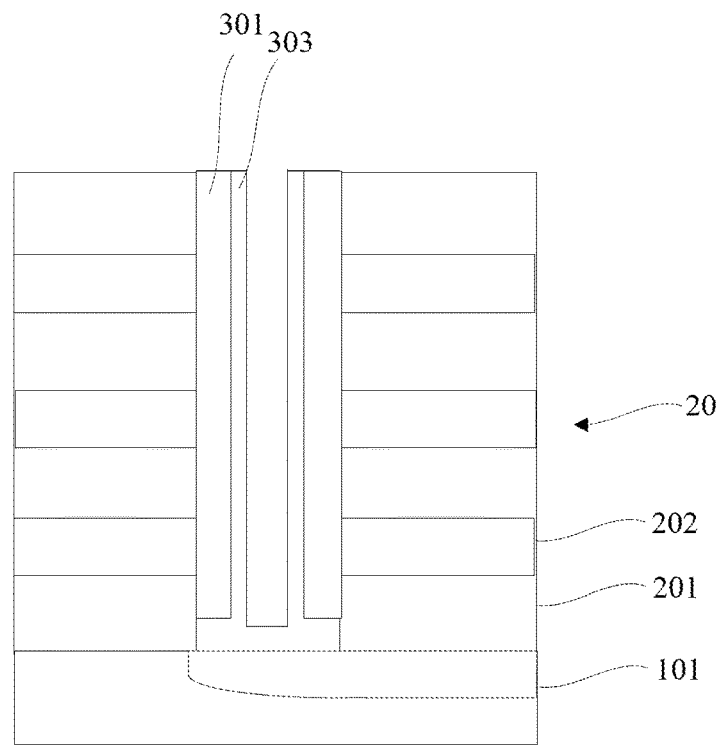
Figure 5B:
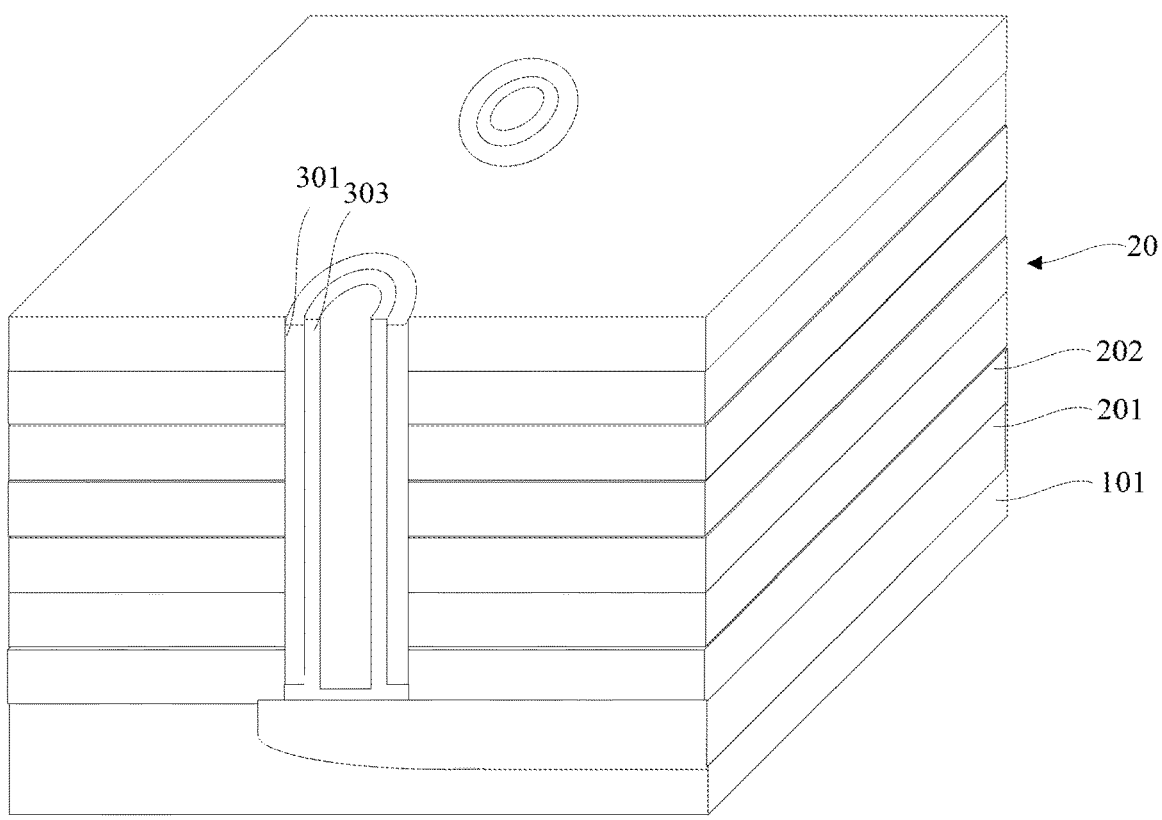

For example, a plasma enhanced chemical vapor deposition process (PECVD), a low pressure chemical vapor deposition process (LPCVD), an atomic layer deposition process (ALD) may be used to form a tunneling dielectric layer 303 at the bottom of the channel hole 203 and on the surface of the weighting gate layer 301, and the tunnel dielectric layer 303 is also filled in the gap 302 to further isolate the weighting gate layer 301 from the substrate 101, as shown in FIGS. 5A and 5B.

Figure 6A:
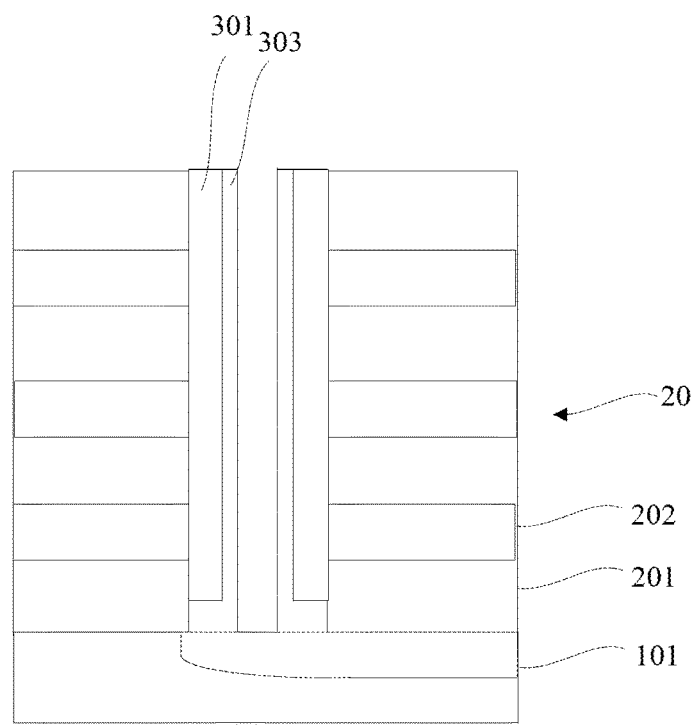
Figure 6B:
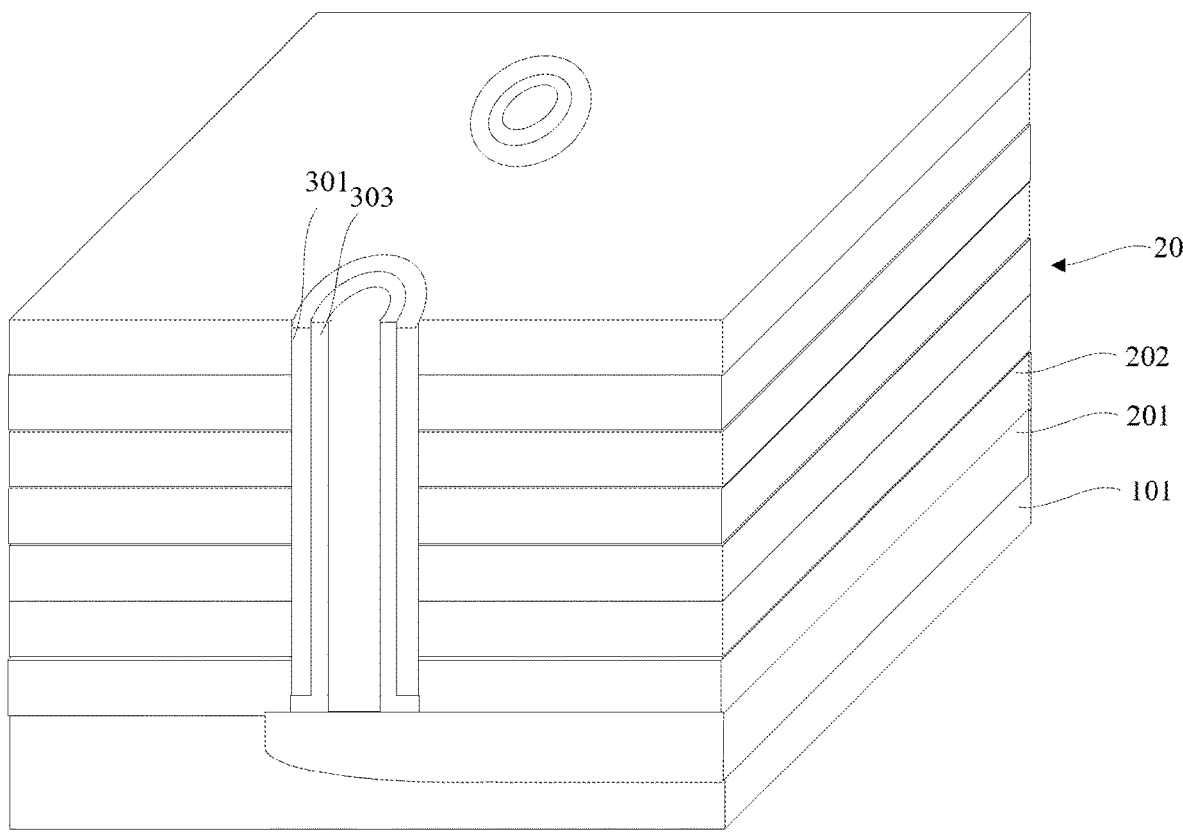

Then, the tunnel dielectric layer 303 at the bottom of the channel hole 203 is etched and removed by a self-alignment dry etching process to expose the substrate 101, as shown in FIGS. 6A and 6B.

Figure 7A:
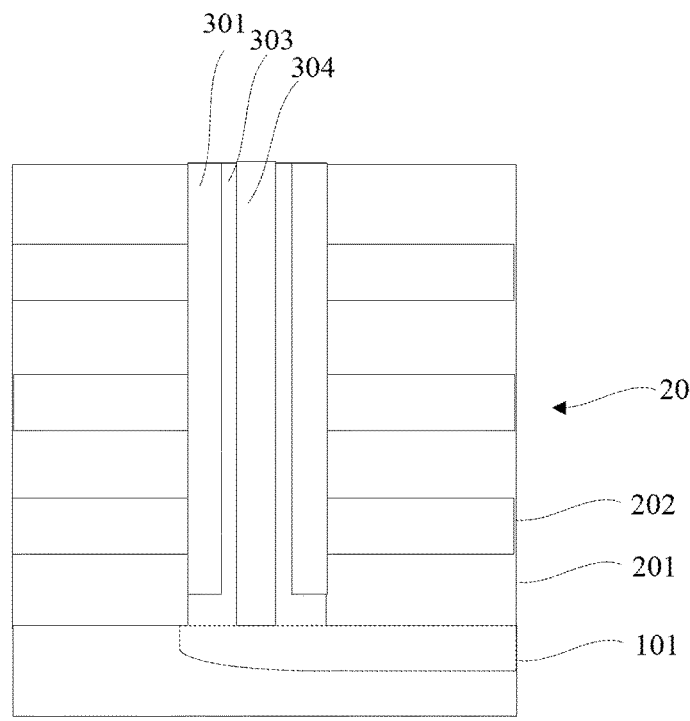
Figure 7B:
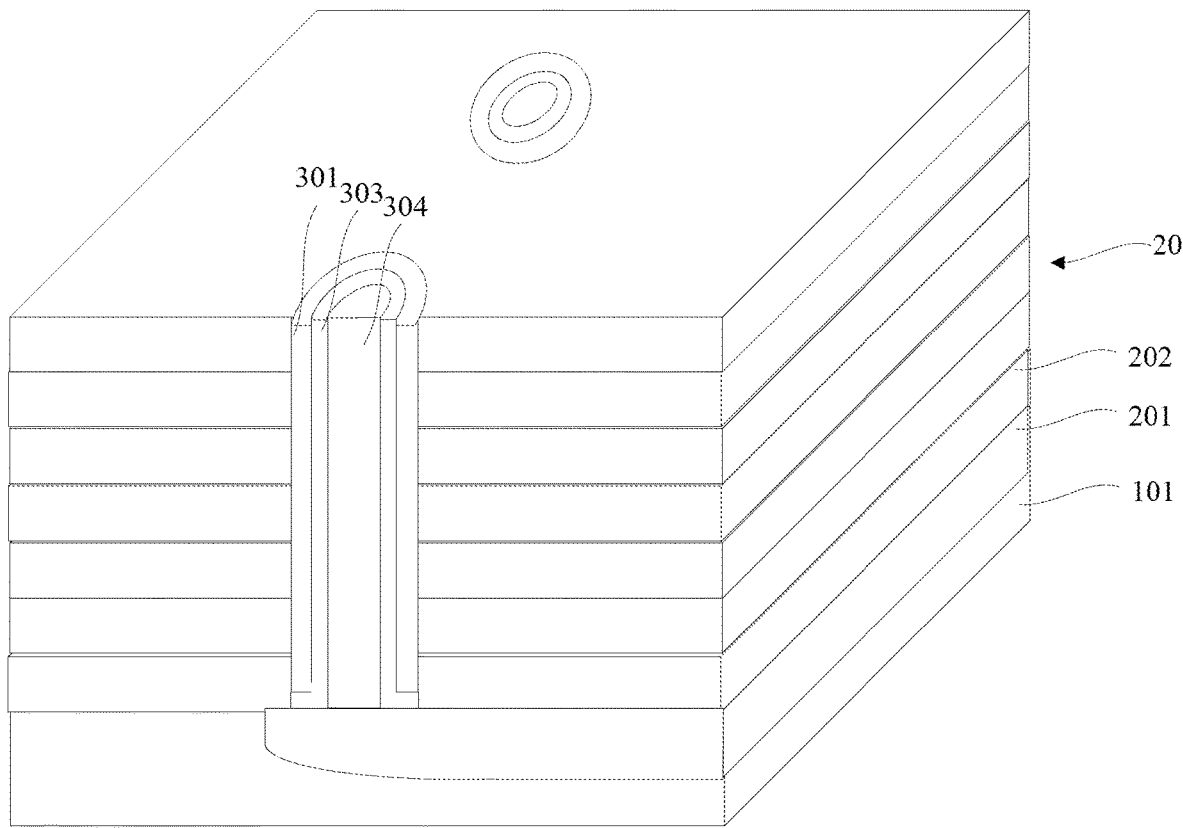

As shown in FIGS. 7A to 7B, step 5) is then performed, and a channel layer 304 is filled in the channel hole 203, and the channel layer 304 is in contact with the substrate 101.

For example, a channel layer 304 may be filled in the channel hole 203 by using a chemical vapor deposition process (CVD) or an atomic layer deposition process (ALD), the channel layer 304 is in contact with the substrate 101, and the substrate 101 has the peripheral circuit to control the switching of the channel layer 304. In this embodiment, the material of the channel layer 304 is n-type doped polysilicon. Of course, the channel layer 304 can also be selected from other semiconductor materials, which is not limited to the examples given here.

As shown in FIGS. 8A-9B, then step 6) is performed, etching trenches 305 are formed in the stacked structure 20, and the sacrificial layer 202 is selectively removed based on the etching trench 305 to form cavities 204.

Figure 8A:
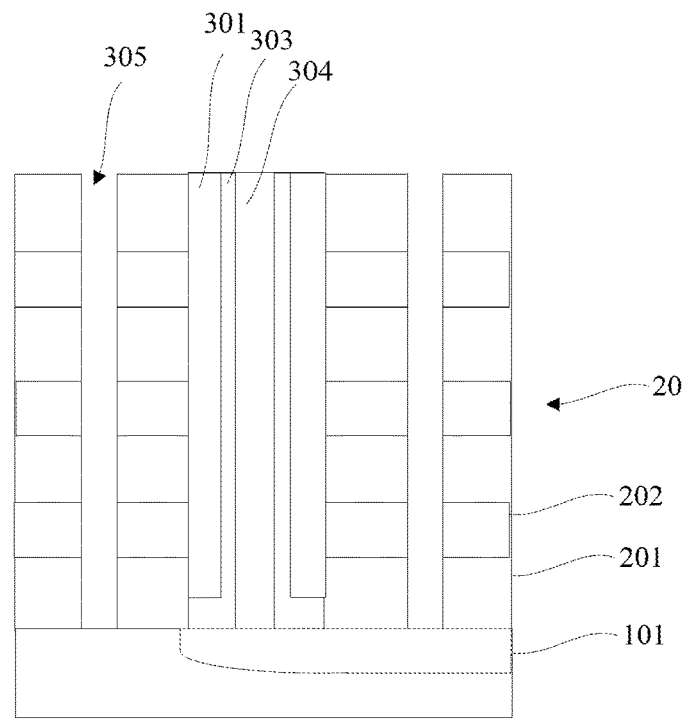
Figure 8B:
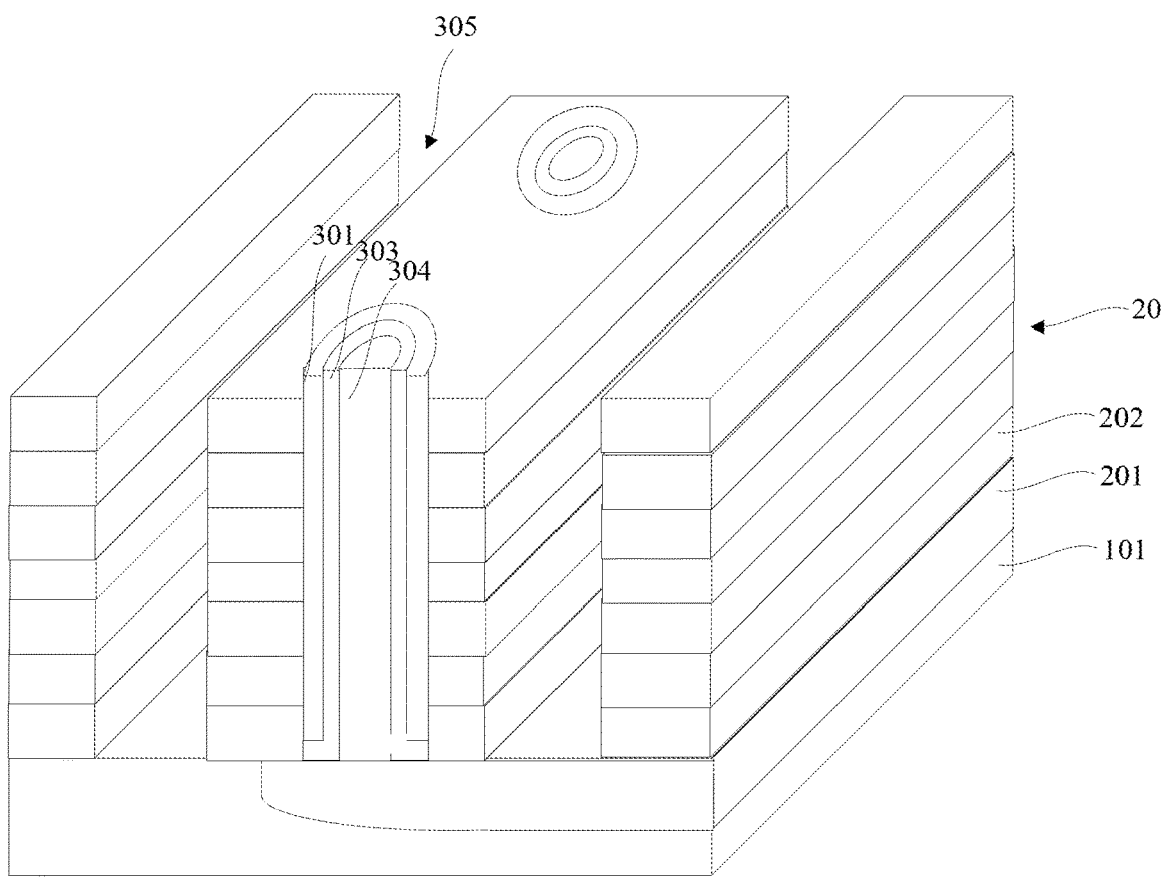
Figure 9A:
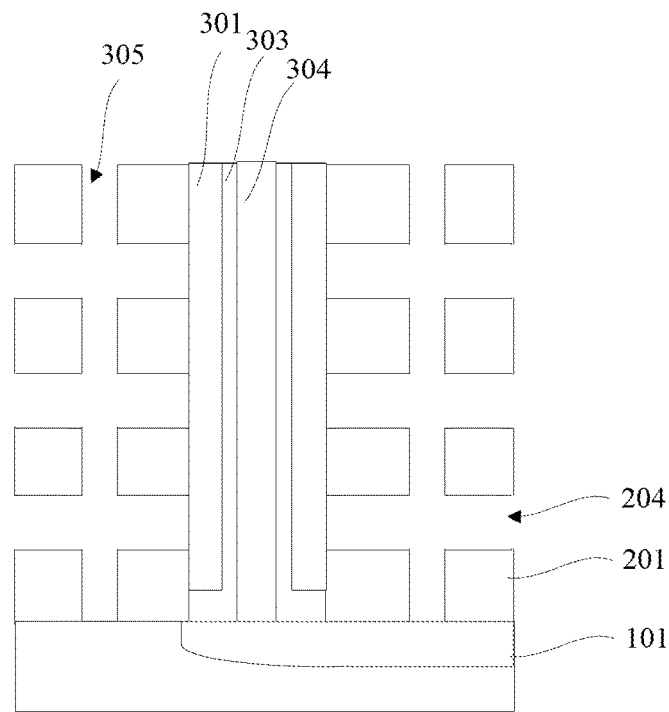
Figure 9B:
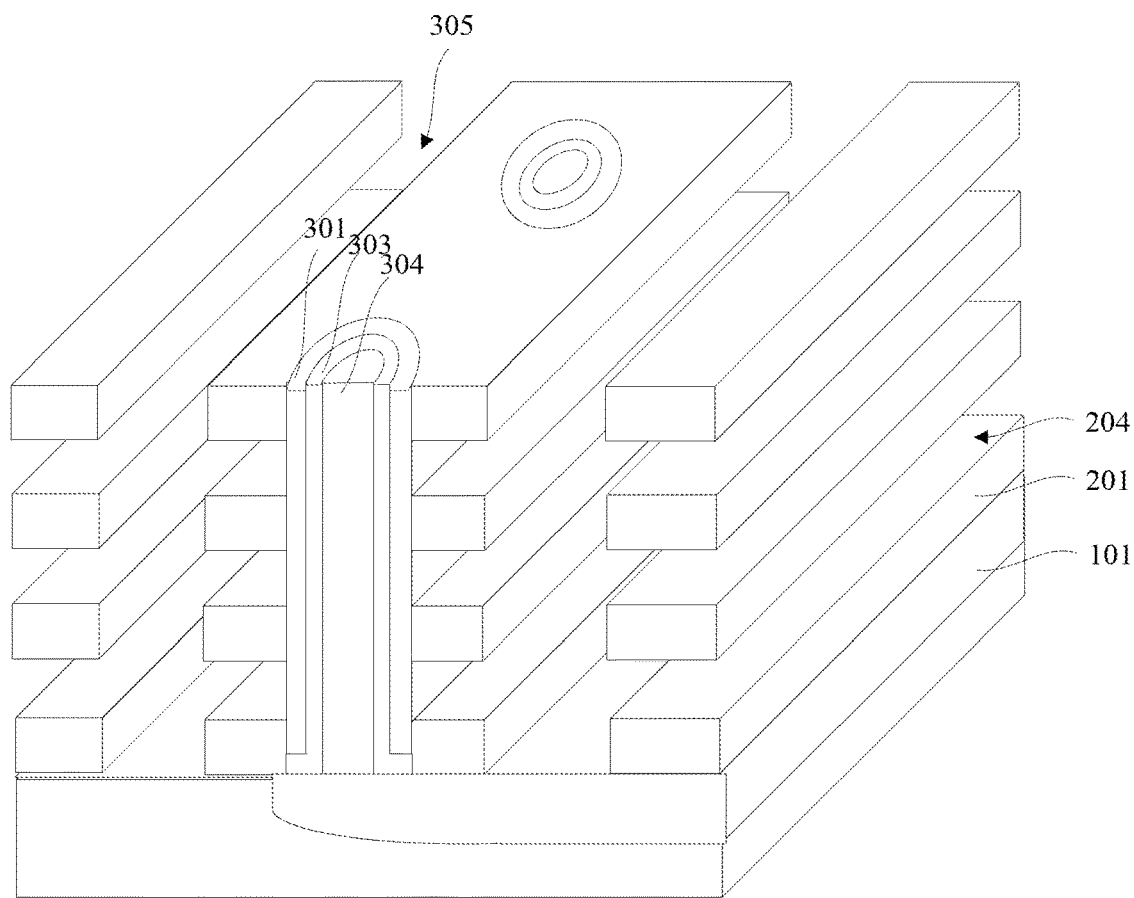

For example, a lithography process and a dry etching process may be used to form an etching trench 305 in the stacked structure 20, and the sidewall of the etching trench 305 exposes the sacrificial layer 202, as shown in FIGS. 8A and 8B; Using a wet etching process to selectively etch the sacrificial layer 202 from the etching trench 305 to remove the sacrificial layer 202 to form a cavity 204 that exposes the sidewall of the weighting gate layer 301, as shown in FIGS. 9A and 9B. Of course, the sacrificial layer 202 can also be removed by selective dry etching, which is not limited to the above-mentioned examples.

Figure 10A:
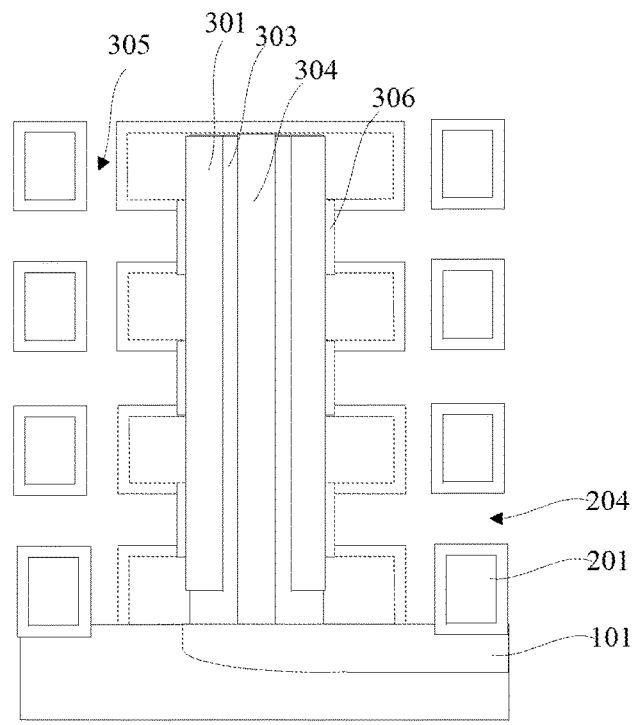
Figure 10B:
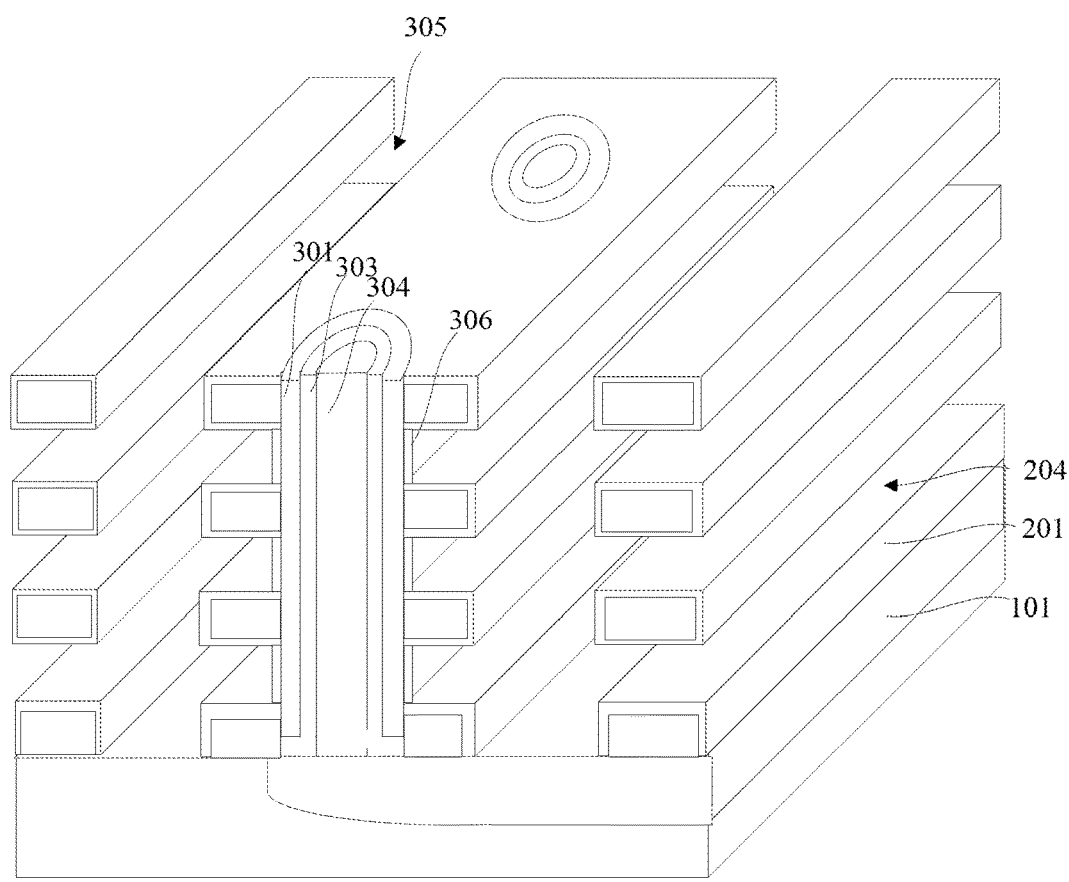

As shown in FIG. 10A to FIG. 10B, step 7) is performed next, a gate dielectric layer 306 is formed on the surface of the cavities 204, and the gate dielectric layer 306 covers the surface of the weighting gate layer 301.

A gate dielectric layer 306 may be formed on the surface of the cavity 204 by using a chemical vapor deposition process (CVD) or an atomic layer deposition process (ALD). The material of the gate dielectric layer 306 includes silicon dioxide or the high k dielectric layer, for example, the high-k dielectric layer may be alumina or the like.

Figure 11A:
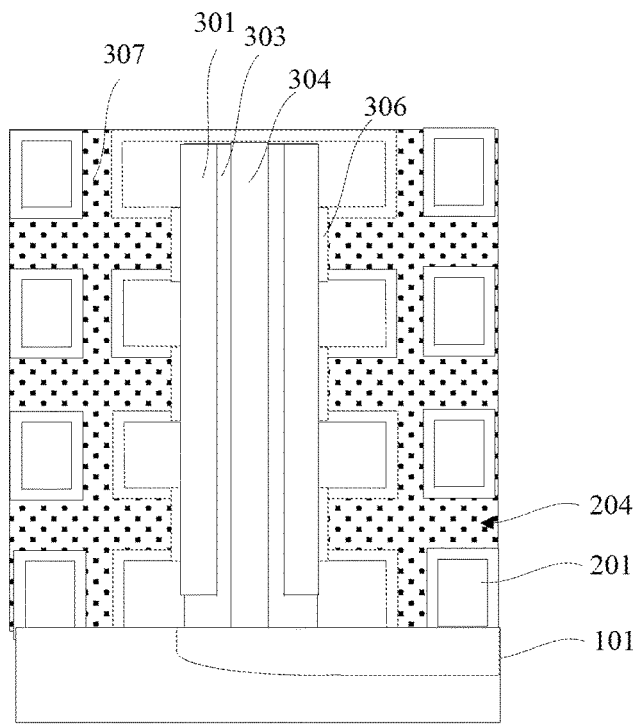
Figure 11B:
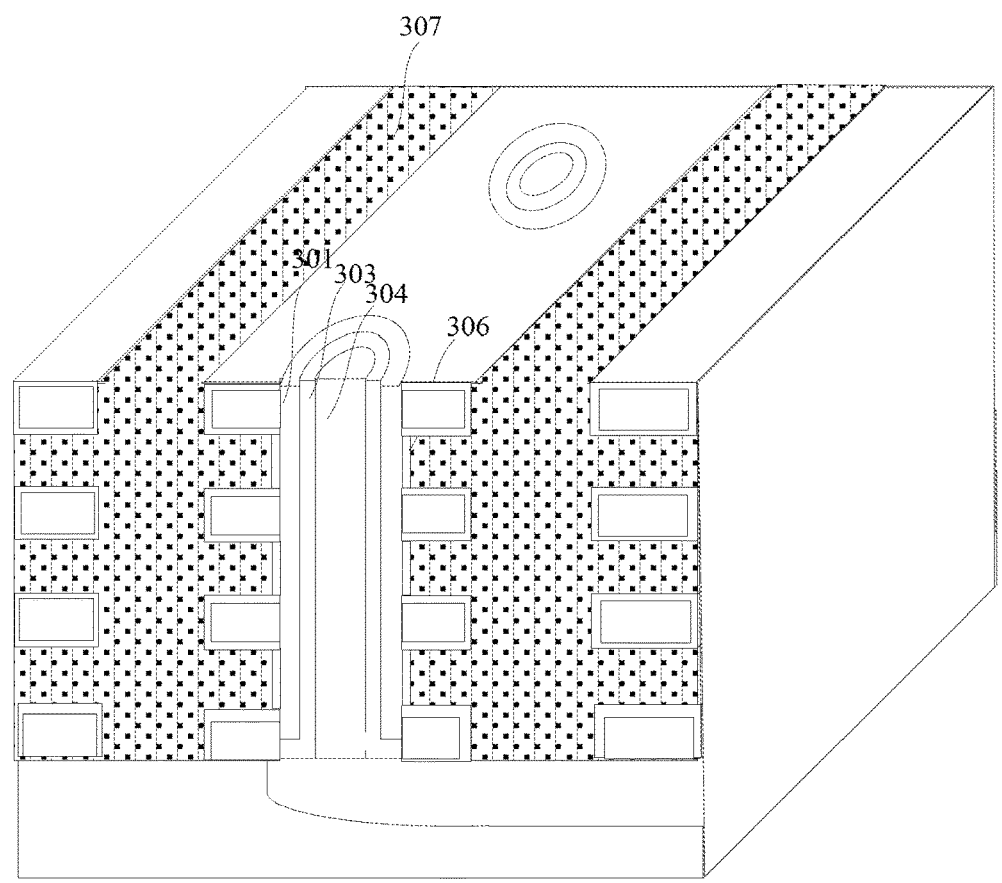

As shown in FIG. 11A to FIG. 11B, step 8) is then performed, and a gate electrode layer 307 is filled in the cavities 204 and the etching trenches 305.

For example, the material of the gate electrode layer 307 comprises one or more of tantalum nitride, titanium nitride, and tungsten. In this embodiment, the material of the gate electrode layer 307 is tantalum nitride.

Figure 12A:
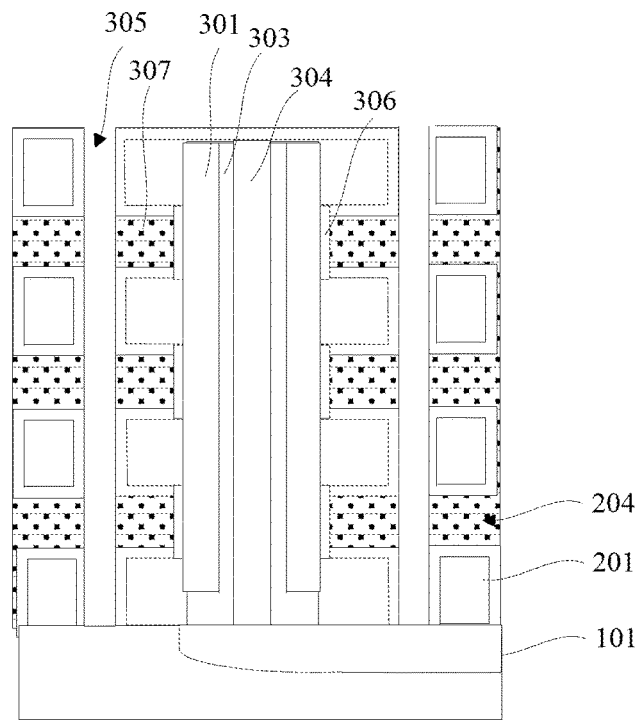
Figure 12B:
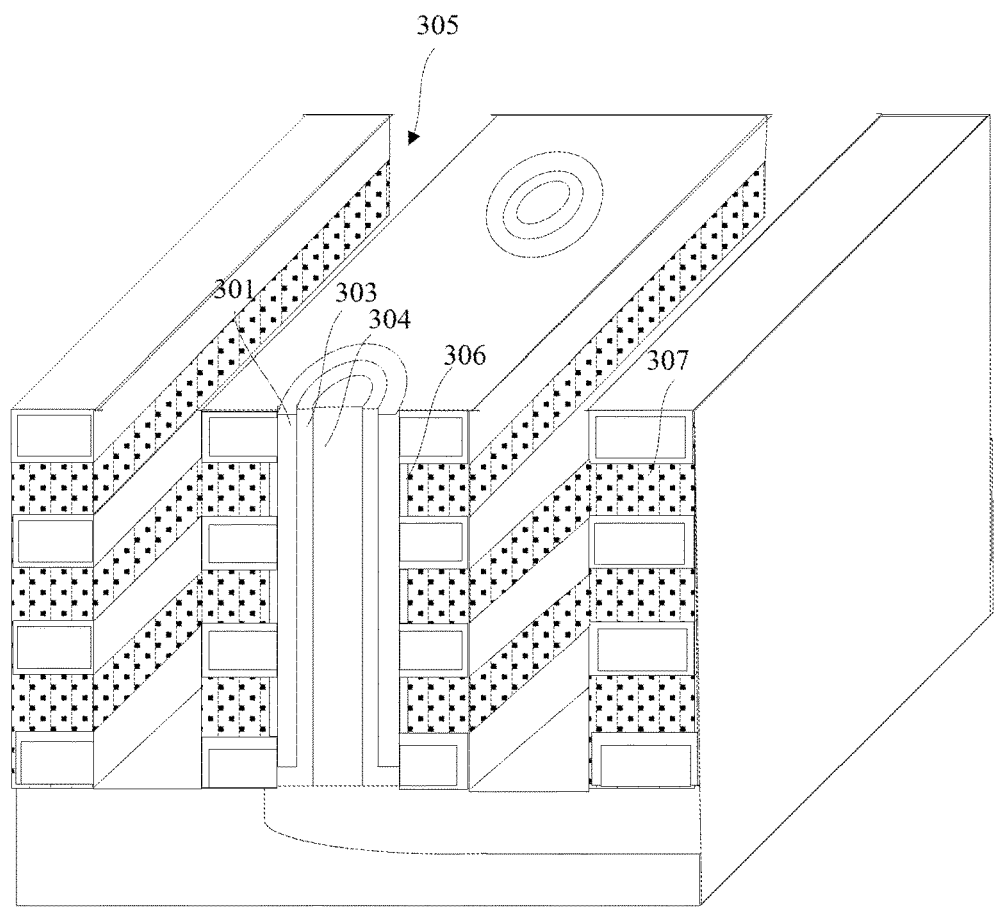
Figure 13:
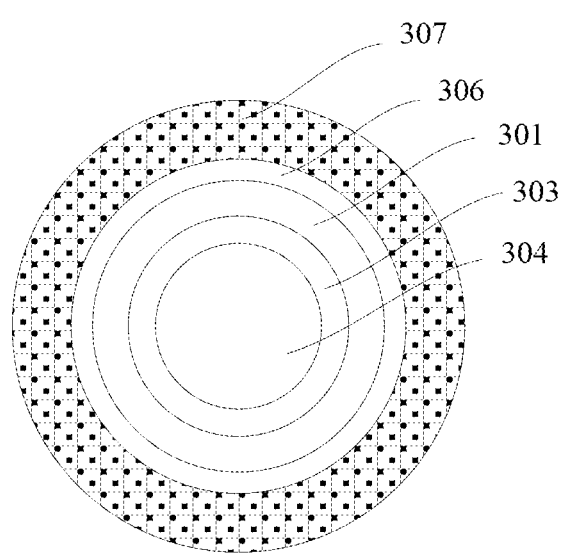

As shown in FIGS. 12A to 13, then proceed to step 9), the gate electrode layer 307 in the etching trench 305 is removed, so that the stacked gate electrode layers 307 are insulated from each other, which is convenient for subsequent layer of the gate electrode layer 307.

Finally, the manufacturing method may further comprise the steps of: forming an insulating layer on the isolation trench and the stack structure 20; forming a through hole in the insulating layer, the through hole revealing the channel layer 304; filling the through hole with conductive material; making a bit line, the bit line is connected to the conductive material.

As shown in FIGS. 12A to 13, this embodiment also provides a three-dimensional junctionless neuron network device, the neuron network device comprises a substrate 101, a stack structure 20, a weighting gate layer 301, the gate dielectric layer 306, the tunneling dielectric layer 303, and the channel layer 304.

The substrate 101 has peripheral circuits. The material of the substrate 101 is selected from monocrystalline silicon, polycrystalline silicon or amorphous silicon; the substrate 101 can also be selected from silicon, germanium, gallium arsenide or silicon germanium compounds; the substrate 101 can also be selected from epitaxial layers or the epitaxial layer is covered with a silicon structure; the substrate 101 may also be other semiconductor materials, which is not limited in the present invention. In this embodiment, the substrate 101 is made of silicon. The substrate 101 has a peripheral circuit, and the peripheral circuit may include a plurality of peripheral components, such as NMOS, PMOS, CMOS, diode, triode, capacitor, etc. The circuit structure of the corresponding function is composed of the above peripheral components, such as SRAM, PLL, CPU, FPGA, etc., to realize the control of three-dimensional junctionless neuron network devices.

A stacked structure 20 is formed on the surface of the substrate 101, the stacked structure 20 comprises alternately stacked gate electrode layers 307 and isolation layers 201, and the material of the gate electrode layer 307 may be one of tantalum nitride, titanium nitride, tungsten or its combination, the material of the isolation layer 201 may be silicon dioxide.

The stacked structure 20 has a channel hole 203 penetrating to the substrate 101, and the channel hole 203 may be cylindrical or elliptical in shape.

The weighting gate layer 301 is formed on the surface of the channel hole 203, and the weighting gate layer 301 and the bottom of the channel hole 203 have a gap 302. The material of the weighting gate layer 301 comprises polysilicon.

The gate dielectric layer 306 is located between the weighting gate layer 301 and the gate electrode layer 307; the material of the gate dielectric layer 306 may be silicon dioxide or a high-k dielectric layer.

The tunneling dielectric layer 303 is located on the surface of the weighting gate layer 301; the tunneling dielectric layer 303 also fills the gap 302 between the weighting gate layer 301 and the bottom of the channel hole 203.

The channel layer 304 is filled in the channel hole 203, and the channel layer 304 is in contact with the substrate 101. The material of the channel layer 304 includes n-type doped polysilicon.

In addition, the three-dimensional junctionless neuron network device further comprises: an insulating layer on the stacked structure 20, the insulating layer has a through hole, the through hole exposes the channel layer 304; conductive material, filled in the through hole; bit line, connected to the conductive material.

A top view of a neuron network unit of the three-dimensional junctionless neuron network device of this embodiment is shown in FIG. 13, the neuron network unit is fully surrounded, and the channel layer 304 is located at the center. The tunnel dielectric layer 303 surrounds the channel layer 304, the weighting gate layer 301 surrounds the tunnel dielectric layer 303, and the gate dielectric layer 306 surrounds the tunnel dielectric layer 303. The gate layer 307 surrounds the gate dielectric layer 306. The neuron network unit of this embodiment adopts a three-dimensional stacked and fully enclosed gate design, on the one hand, it can improve the integration of neuron devices, and on the other hand, it can improve the gate. Extreme ability to control components. Moreover, the neuron network device used in this embodiment adopts a junctionless transistor structure. On the one hand, the injection steps of the source and drain regions can be eliminated, which greatly reduces the difficulty of the process. On the other hand, the carrier can avoid incompleteness. The interface between the gate oxide layer and the semiconductor channel. Most carriers in the channel move in the semiconductor channel instead of the surface. The carrier is limited by the interface scattering, which improves the carrier mobility, reduces the error, and increases the response speed of the device.

As described above, the three-dimensional junctionless neuron network device of the present invention and its manufacturing method have the following beneficial effects:

The present invention realizes a three-dimensional junctionless neuron network device and its manufacturing method, using vertically stacked isolation layer 201 and gate electrode layer 307 design, the stack structure 20 has an array of channel holes 203, through the channel A vertically distributed neuron network device string with a fully enclosed gate design is formed in the hole 203, on the one hand, the integration of the neuron device can be improved, and on the other hand, the gate electrode can control the device.

The neuron network device used in the present invention adopts a junctionless transistor structure, on the one hand, it can avoid the injection steps of the source and drain regions, greatly reducing the difficulty of the process, on the other hand, the carrier can avoid incomplete interface between the gate oxide layer and the semiconductor channel. Most carriers in the channel move in the semiconductor channel instead of the surface. The carrier is limited by the interface scattering, which improves the carrier mobility, reduces the error, and increases the response speed of the device.

Therefore, the present invention effectively overcomes various shortcomings in the prior art and has high industrial utilization value.

While various embodiments in accordance with the disclosed principles been described above, it should be understood that they are presented by way of example only, and are not limiting. Thus, the breadth and scope of exemplary embodiment(s) should not be limited by any of the above-described embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantage.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings herein.

What is claimed is:

1. A manufacturing method of a three-dimensional junctionless neuron network device, comprising the steps of:
   1) providing a substrate with a stack structure formed on the surface of the substrate, wherein the stack structure comprises alternately stacked sacrificial layers and isolation layers;
   2) etching the stack structure to form at least one channel hole penetrating to the substrate;
   3) forming a weighting gate layer on the surface of the channel hole, and etching the weighting gate layer on the bottom of the channel hole to isolate the weighting gate layer and the substrate;
   4) forming a tunneling dielectric layer on the bottom of the channel hole and the weighting gate layer, and etching the tunneling dielectric layer on the bottom of the channel hole to expose the substrate;
   5) filling in a channel layer in the channel hole, the channel layer in contact with the substrate;
   6) forming at least one etching trench in the stack structure, and selectively etching the sacrificial layer to form at least one void;
   7) forming a gate dielectric layer on the surface of the void;
   8) forming a gate electrode layer in the void and the etching trench; and
   9) removing the gate electrode layer in the etching trench.

2. The manufacturing method according to claim 1, wherein the sacrificial layer comprises borosilicate glass or silicon nitride, and the isolation layer comprises silicon dioxide.

3. The manufacturing method according to claim 1, wherein the channel hole has a shape of a cylinder or an elliptical cylinder.

4. The manufacturing method according to claim 1, wherein the weighting gate layer formed on the surface of the channel hole by using chemical vapor deposition process or atomic layer deposition process in step 3), and the weighting gate layer comprises a polysilicon layer.

5. The manufacturing method according to claim 1, wherein a gap is formed between the weighting gate layer and the substrate after etching the weighting gate layer on the bottom of the channel hole in step 3), and the tunneling dielectric layer filled in the gap in step 4).

6. The manufacturing method according to claim 1, wherein the channel layer comprises an n type doped polysilicon.

7. The manufacturing method according to claim 1, wherein the gate dielectric layer comprises silicon dioxide or high-k dielectric material in step 7).

8. The manufacturing method according to claim 1, wherein the gate electrode layer comprises one of tantalum nitride, titanium nitride and tungsten or its combination in step 8).

9. The manufacturing method according to claim 1, further comprising the steps of:
   forming an insulating layer on the etching trench and the stack structure;
   forming a through hole in the insulating layer, the through hole exposing the channel layer;
   filling the through hole with conductive material; and
   forming at least one bit line, and the bit line connected to the conductive material.

* * * * *